(12) United States Patent
Kitamura (10) Patent No.: US 8,765,594 B2
(45) Date of Patent: Jul. 1, 2014

(54) METHOD OF FABRICATING SEMICONDUCTOR DEVICE ALLOWING SMOOTH BUMP SURFACE

(76) Inventor: Yoshihiro Kitamura, Tokyo (JP)

( * ) Notice: Subject to any disclaimer, the term of this patent is extended or adjusted under 35 U.S.C. 154(b) by 266 days.

(21) Appl. No.: 13/167,448

(22) Filed: Jun. 23, 2011

(65) Prior Publication Data

US 2011/0318918 A1    Dec. 29, 2011

(30) Foreign Application Priority Data

Jun. 24, 2010   (JP) .................. 2010-143754

(51) Int. Cl.
*H01L 21/28* (2006.01)

(52) U.S. Cl.
USPC .......................................... 438/614; 438/613

(58) Field of Classification Search
CPC ........ H01L 24/11; H01L 24/13; H01L 10/145
USPC .................................................. 438/613, 614
See application file for complete search history.

(56) References Cited

U.S. PATENT DOCUMENTS

| 6,613,663 B2 * | 9/2003 | Furuya ........................... 438/613 |
| 6,743,660 B2 * | 6/2004 | Lee et al. ....................... 438/108 |
| 7,786,502 B2 * | 8/2010 | Sakai ............................. 257/99 |
| 2006/0011482 A1 * | 1/2006 | Barkey ........................... 205/109 |
| 2007/0141750 A1 * | 6/2007 | Iwasaki et al. ................. 438/108 |
| 2009/0184156 A1 * | 7/2009 | Matsui et al. .................. 228/203 |

FOREIGN PATENT DOCUMENTS

| JP | 11-163036 | 6/1999 |
| JP | 2001-058259 | 3/2001 |
| JP | 2004-006818 | 1/2004 |
| JP | 2007-294990 | 11/2007 |
| JP | 2012-009597 | 1/2012 |
| WO | 2008/050376 | 5/2008 |

OTHER PUBLICATIONS

Deng, X, et al. Influence of Initial Morphology and Thickness of Cu6Sn5 andCu3Sn Intermetallics on Growth and Evolution during Thermal Aging of Sn—Ag Solder/Cu Joints, Journal of Electronic Materials, vol. 32, No. 12, 2003, pp. 1403-1413.*
Japanese Official Action—2010-143754—Mar. 25, 2014.

* cited by examiner

*Primary Examiner* — Charles Garber
*Assistant Examiner* — Stanetta Isaac
(74) *Attorney, Agent, or Firm* — Young & Thompson (57) ABSTRACT

A method of fabricating a semiconductor device, includes: removing, after forming solder for forming a plurality of bumps on a semiconductor substrate, an oxide film formed on a surface of the solder while heating the semiconductor substrate with first radiant heat; and heating the semiconductor substrate with an amount of second radiant heat that is greater than the amount of the first radiant heat by holding the semiconductor substrate at a position apart from a front surface of a heater stage at a predetermined distance to reflow the solder from which the oxide film is removed.

4 Claims, 5 Drawing Sheets

METHOD OF FABRICATING SEMICONDUCTOR DEVICE ALLOWING SMOOTH BUMP SURFACE

This application is based upon and claims the benefit of priority from Japanese Patent Application No. 2010-143754 filed on Jun. 24, 2010, the content of which is incorporated by reference.

BACKGROUND OF THE INVENTION

1. Field of the Invention

The present invention relates to a method of fabricating a semiconductor device and an apparatus for fabricating a semiconductor device.

2. Description of the Related Art

In installing a semiconductor device on a printed circuit board, the semiconductor device is encapsulated with resin or the like and the semiconductor device is protected from an external environment, in order to facilitate the handling of the semiconductor device. In mounting the encapsulated semiconductor device, electrodes formed both on the semiconductor device and the printed circuit board are connected to each other using a lead frame. In an early phase of development, the electrodes of the semiconductor device are connected to the lead frame through wires made of gold (Au) or the like. In doing so, it is necessary that the semiconductor device be brought close to the lead frame and placed thereon and space for routing wires be provided between them.

In order to satisfy market requirements for a reduction in the size of semiconductor devices together with requirements for high integration of these semiconductor devices, projecting terminals (in the following, referred to as bumps) are used instead of wire connections.

The term "bump" here means a terminal that is projected from the main surface of the semiconductor device, which is formed by laminating solder on the electrode of the semiconductor device; electrodes are connected to each other through this solder. More specifically, bumps are formed at predetermined positions on the front and rear surface of a plurality of semiconductor chips to be connected, and the bumps formed on the front surface of a semiconductor chip and the bumps formed on the rear surface of another semiconductor chip are aligned and compressed to each other for bonding. With this scheme, it is possible to stack and electrically connect a plurality of semiconductor chips to each other without using wires. According to this connection method using bumps, it is possible that a lead frame is laid on a semiconductor device and the lead frame and the semiconductor device are electrically connected to each other. Thus, space can be saved, and this method is effective for reducing the size of the semiconductor device.

In the forming of bumps, one method that is typical is one in which the electrodes are formed on the semiconductor device and the solder is then plated thereon. However, projections and depressions are formed on the surface of the solder formed by plating, and air bubbles are caught in the depressions which cause a reduction in connection strength if the bumps are connected to the lead frame as they are. In order to prevent this, heat treatment is performed such that solder is heated at a temperature above its melting point to smooth the solder surface before connecting the bumps to the lead frame. In the following, this heat treatment is referred to as reflow.

Various schemes are disclosed concerning reflow. For example, JP11-163036A discloses a method of using radiant heat emitted from a halogen lamp. JP2004-6818A and JP2001-58259A disclose methods performed with conductive heat using a heater.

However, methods using a halogen lamp for a heat source like the method in JP11-163036A separately need a reflecting mirror or a reflector in addition to the lamp, so that there is a problem in that the configuration of a fabrication apparatus becomes complicated.

In the methods disclosed in JP2004-6818A and JP2001-58259A, because a wafer on which semiconductor devices are formed comes into direct contact with the heater, some portions of the wafer come into contact with the heater and some do not come into contact with the heater if there is warpage or the like on the wafer. In this case, variations occur in heating semiconductor devices, causing a problem in that solder cannot be smoothed. In addition, JP2007-294990A discloses a technique concerning an ashing method for a photoresist.

SUMMARY

In one embodiment, there is provided a method of fabricating a semiconductor device is a method of fabricating a semiconductor device having a plurality of bumps formed on a semiconductor substrate, the method including: removing, after forming solder for forming the plurality of bumps on the semiconductor substrate, an oxide film formed on a surface of the solder while heating the semiconductor substrate with first radiant heat; and heating the semiconductor substrate with an amount of second radiant heat that is greater than the amount of the first radiant heat by holding the semiconductor substrate at a position apart from a front surface of a heater stage at a predetermined distance to reflow the solder from which the oxide film is removed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The configuration of an apparatus for fabricating a semiconductor device according to this embodiment will be described.

The outline of reflow apparatus 1 used for forming bumps of a semiconductor device according to this embodiment will be described with reference to FIG. 1.

Figure 1:
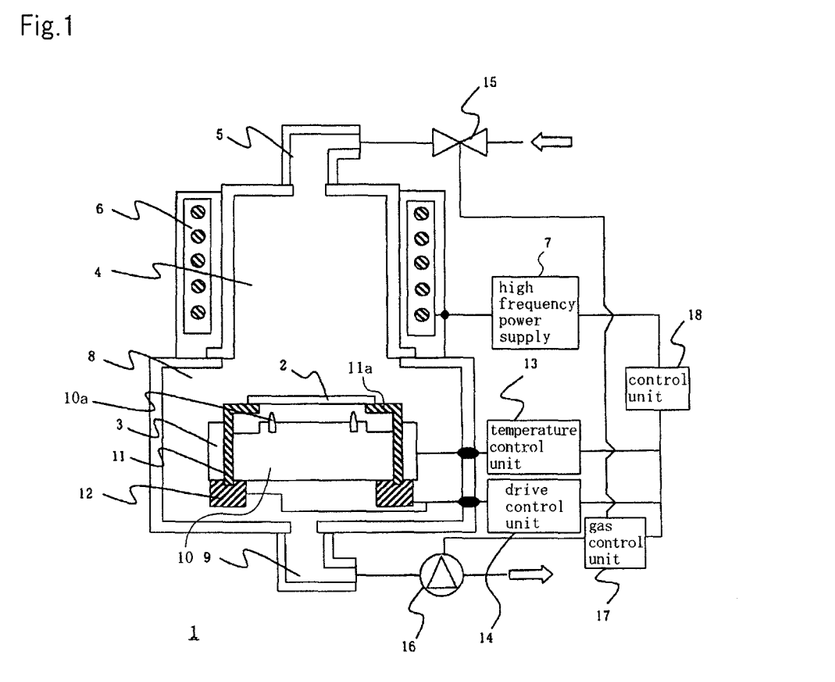
FIG. 1 is a cross sectional view depicting the configuration of a fabrication apparatus for use in forming bumps of a semiconductor device according to this embodiment.

As shown in FIG. 1, reflow apparatus 1 is configured to include graphite heater stage 3 that heats wafer 2 while holding it, gas inlet port 5 that introduces a process gas into chamber 4, the process gas being a plasma source in reduction, coil 6 that surrounds the side wall of chamber 4 for producing an electric field used to turn a process gas into plasma, high frequency power supply 7 connected to coil 6, chamber 8 for processing wafer 2 therein, and gas outlet port 9 that evacuates the process gas in chamber 8 while processing wafer 2 or after processing wafer 2. Wafer 2 is a semiconductor substrate which is described later.

A high frequency current of 27.12 MHz is carried from high frequency power supply 7 to coil 6 to produce an electric field in chamber 4, and the electric field induces an electric discharge for turning the process gas into plasma. The produced plasma reaches the front surface of wafer 2 placed in chamber 8.

Heater stage 3 is provided with ceramic holder 10 and holding pins 10a protruded from the top surface of holder 10 for holding wafer 2 by point contact. The top tip end of holding pin 10a is in a tapered shape for point contact with wafer 2. Moreover, heater stage 3 is further provided with ceramic support 11 that is capable of vertically changing the height while holding wafer 2, and drive unit 12 that moves support 11. Furthermore, the top of support 11 is formed of support arms 11a horizontally extended to place wafer 2 thereon. Holder 10 and support 11 each include a heater to allow temperature control. A driving method for support 11 by drive unit 12 may be a mechanical drive or air drive.

Temperature control unit 13 is provided to perform the temperature management of heater stage 3, and temperature control unit 13 is connected to heater stage 3 through a signal line. Drive control unit 14 is provided to manage the operation of support 11, and drive control unit 14 is connected to drive unit 12 through a signal line. Wafer 2 can be heated at desired temperatures by temperature control unit 13 and drive control unit 14.

Moreover, valve 15 is provided at the midway point of a gas pipe connected to gas inlet port 5. Vacuum pump 16 is provided at the midway point of a gas pipe connected to gas outlet port 9. Gas control unit 17 is provided, which is connected to valve 15 and vacuum pump 16 through signal lines. Gas control unit 17 controls valve 15 and vacuum pump 16 to control and manage the flow rates of process gases introduced into chambers 4 and 8 and the pressures in chambers 4 and 8.

Furthermore, control unit 18 is provided, which is connected to high frequency power supply 7, temperature control unit 13, drive control unit 14, and gas control unit 17 mentioned above through signal lines. Control unit 18 includes a CPU (central Processing unit), not shown, which performs processing according to a program, and a memory, not shown, which stores the program therein. Control unit 18 sends control signals to the individual components of high frequency power supply 7, temperature control unit 13, drive control unit 14, and gas control unit 17 according to the program having process conditions described therein for controlling the timing of these components and for managing these components so that the individual components do not interfere with each other and they operate smoothly.

In addition, heater stage 3 may be made of ceramics or metal. Furthermore, in this embodiment, the case is described in which holder 10 and support 11 are made of ceramics. However, they may be metal, not limited to ceramics similar to heater stage 3.

Here, the configuration of heater stage 3 shown in FIG. 1 will be described in detail.

Figure 2:
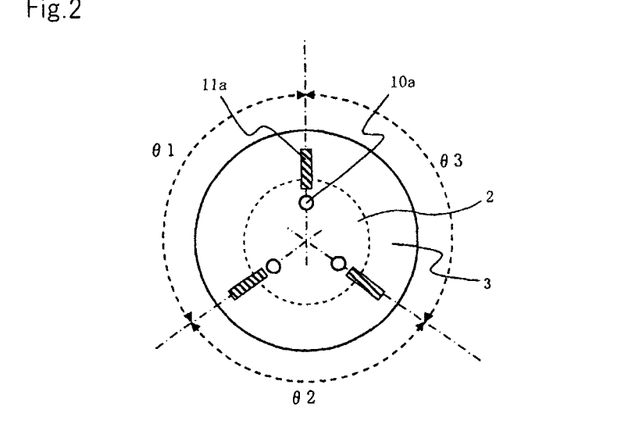
FIG. 2 is a plan view depicting an exemplary configuration of a heater stage shown in FIG. 1.

FIG. 2 is a plan view depicting heater stage 3 when seen from above. As shown in FIG. 2, heater stage 3 is in a circular shape like wafer 2. FIG. 2 shows the position of the outer edge of wafer 2 by a broken line when wafer 2 is placed on holding pin 10a or support arm 11a. In this embodiment, holder 10 is configured to include three holding pins 10a, and support 11 is configured to include three support arms 11a.

Three holding pins 10a are placed on the concentric circle of heater stage 3, and the central angle corresponding to the arc connecting two adjacent holding pins 10a has an angle of 120°. Three support arms 11a are also placed on the concentric circle of heater stage 3, and placed on the circle having a larger radius than that of the circle on which three holding pins 10a are placed; the central angle corresponding to the arc connecting two adjacent support arms 11a has an angle of 120°. FIG. 2 shows these central angles by θ1 to θ3. Three holding pins 10a and three support arms 11a are individually placed on straight lines passing through the center of heater stage 3, and holding pins 10a are placed at the positions closer to the center of heater stage 3 than support arms 11a.

Moreover, in this embodiment, the reason why central angles θ1 to θ3 have an angle of 120° is that this angle corresponds to the configuration in which three holding pins 10a and three support arms 11a are placed at equal intervals. The numbers of holding pins 10a and support arms 11a may be three or more if adjacent holding pins 10a and support arms 11a are placed at equal intervals. Furthermore, four or more of holding pins 10a may be placed in a grid.

In addition, in this embodiment, each of three holding pins 10a of holder 10 has a structure in which the tip end that comes into contact with wafer 2 is sharp like a needle point as compared with the tip end that comes into contact with heater stage 3, in order to reduce the contact area with wafer 2 as small as possible. With this structure, wafer 2 comes into contact with holding pins 10a by point contacts when wafer 2 is supported by holder 10.

Figure 3A:
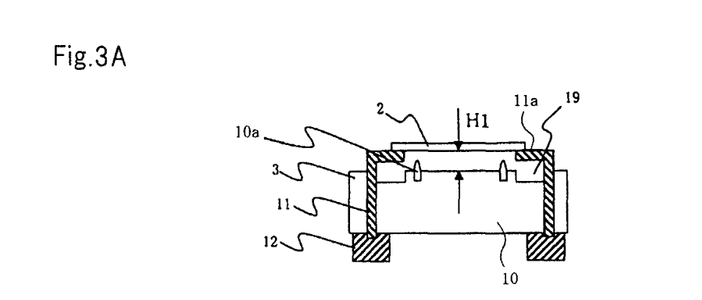
FIG. 3A is a cross sectional view depicting the heater stage shown in FIG. 2 when a support is lifted.

The state of wafer 2 when support 11 is lifted will be described in the arrangement of holder 10 and support 11 with reference to FIG. 2. FIG. 3A is a cross sectional view depicting heater stage 3 when support 11 is lifted.

For lifting support 11, drive control unit 14 operates drive unit 12 according to control signals received from control unit 18, and moves three support arms 11a of support 11 vertically upwards with respect to heater stage 3. Support 11 is lifted to support wafer 2 only with support arms 11a. In this state, wafer 2 does not come into contact with holding pins 10a and is located away from heater stage 3 at distance H1. Distance H1 is 10 mm here. Consequently, heater stage 3 heats wafer 2 with radiant heat from heater stage 3, not conductive heat transfer, because heater stage 3 is located away from wafer 2 at distance H1.

In addition, because the efficiency of heat transfer is more reduced than that of conductive heat transfer when distance H1 is 10 mm, the temperature rise rate of wafer 2 is about 100° C./min. In the process of removing an oxide film formed on the bump surface, described later, wafer 2 is placed in the state shown in FIG. 3A.

Figure 3B:
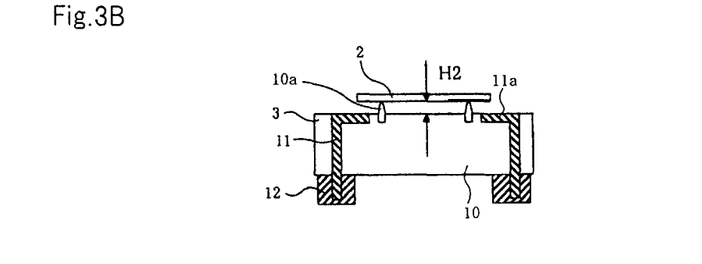
FIG. 3B is a cross sectional view depicting the heater stage shown in FIG. 2 when the support is lowered.

Next, the state of wafer 2 when support 11 is lowered will be described. FIG. 3B is a cross sectional view depicting heater stage 3 when support 11 is lowered.

In the case of lowering support 11, drive control unit 14 operates drive unit 12 according to control signals received from control unit 18, and accommodates three support arms 11a of support 11 in grooves 19 formed on the top surface of heater stage 3. In this state, wafer 2 is supported only by holding pins 10a, and is located away from heater stage 3 at distance H2 without directly coming into contact with heater stage 3. Here, wafer 2 is supported at distance H2 that is 0.15 mm. Consequently, heater stage 3 heats wafer 2 with radiant heat from heater stage 3, not with conductive heat transfer, because heater stage 3 is located away from wafer 2 at distance H2. On accommodating support arms 11a of support 11 in grooves 19 provided on heater stage 3, the top surface of support arm 11a is matched with the top surface of heater stage 3 or lower than the top surface of heater stage 3, so that it is possible to support wafer 2 only by holding pins 10a without support arms 11a coming into contact with wafer 2.

Because distance H2 is smaller than distance H1 when support 11 is lifted, the temperature rise rate is improved than when support 11 is lifted, and the temperature rise rate of wafer 2 is 200° C./min. While processing in the reflow process, which is described later, wafer 2 is placed in the state shown in FIG. 3B.

In addition, in the case shown in FIG. 3B, because heat is conductively transferred from heater stage 3 to wafer 2 through holding pins 10a, it does not seem to be "heating completely only with radiant heat". However, individual holding pins 10a of holder 10 come into contact with wafer 2 by point contact, so that the ratio of conductive heat transfer is so smaller than the ratio of radiant heat, as regards heating wafer 2, that it is negligible.

As described above, the height of support 11 supporting wafer 2 is varied by control of control unit 18 in order to change the amount of radiant heat from heater stage 3 to wafer 2. In the following, in terms of radiant heat from heater stage 3 to wafer 2, radiant heat in the case shown in FIG. 3A is referred to as first radiant heat, and radiant heat in the case shown in FIG. 3B is referred to as second radiant heat.

Here, consideration will be given to the range of distance H2. First, the minimum value of distance H2 will be considered. If distance H2=0, wafer 2 will come into contact with heater stage 3. In this case, as described in Description of the Related Art, if wafer 2 is warped, the rate of the temperature rise of the portion that comes into contact with heater stage 3 will be faster than that of the other portions on the rear surface of wafer 2. The minimum value of distance H2 is a value greater than zero.

The maximum value of distance H2 will be considered. If distance H2 is excessively increased, the temperature rise rate of wafer 2 will slow in the reflow process. The maximum value of distance H2 is determined depending on that how much the temperature rise rate of wafer 2 is set in the reflow process. For example, if it is sufficient that the temperature rise rate of wafer 2 is above 100° C./min. in the reflow process, the range of distance H2 will be 0<H2<H1.

However, it is necessary to set the height from the top surface of heater stage 3 to the top of holding pin 10a by taking into account variations in the warpage of wafer 2. The degree of the warpage of wafer 2 is related to thermal stress caused by heat treatment, film stress in film deposition processing, etc.

For example, if wafer 2 that has a small warpage is placed on holding pin 10a and the height from the top surface of heater stage 3 to the top of holding pin 10a is fixed so that distance H2 becomes the optimum, it is likely that wafer 2 that has a large warpage will come into contact with heater stage 3 when this wafer 2 is placed on holding pins 10a. Because of this, it is desirable to determine the height from the top surface of heater stage 3 to the top of holding pin 10a so that the distance will satisfy H2>0, and not be based on the degree of warpage of wafer 2.

In addition, even though the distance satisfies H2<H1, the reflow characteristics of a plurality of solder bumps, which are formed on a silicon semiconductor substrate having a diameter of 300 mm, tend to vary when distance H2 becomes closer to distance H1. It is thought that the reason for this is because variations in the temperature rise rate are increased in the semiconductor substrate. The optimum value of distance H2 that had been found based on experiments ranged from 0.1 to 0.3 mm. If the distance is in this range, the reflow characteristics of solder bumps in the order of a million solder bumps, which are equally arranged on a silicon semiconductor substrate having a diameter of 300 mm, can be stably maintained. In this embodiment, distance H2 is 0.15 mm.

Next, a method of forming the bumps of the semiconductor device according to this embodiment will be described.

Figure 6:
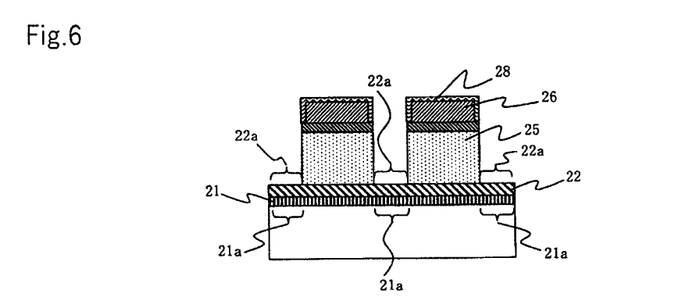
FIG. 6 is a cross sectional view depicting the method of forming the bumps of the semiconductor device according to this embodiment.
Figure 7:
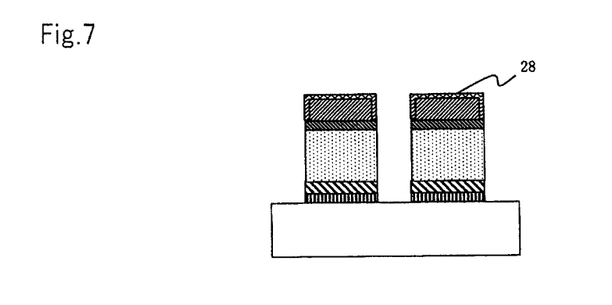
FIG. 7 is a cross sectional view depicting the method of forming the bumps of the semiconductor device according to this embodiment.
Figure 8:
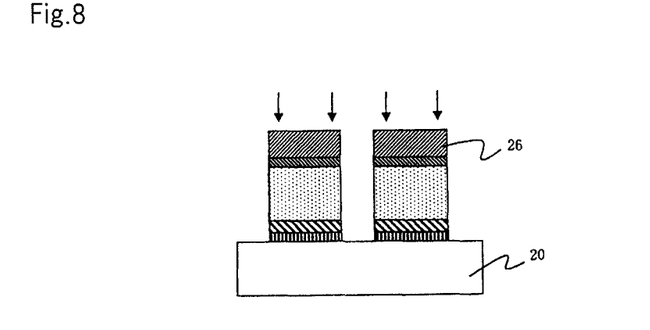
FIG. 8 is a cross sectional view depicting the method of forming the bumps of the semiconductor device according to this embodiment.
Figure 9A:
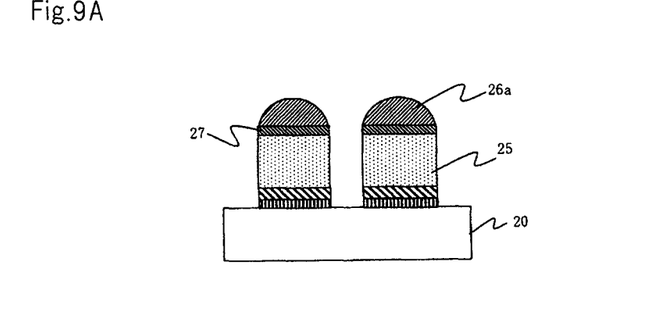
FIG. 9A is a cross sectional view depicting the method of forming the bumps of the semiconductor device according to this embodiment.

FIG. 4A and FIGS. 5 to 9A are cross sectional views depicting a method of forming the bumps of the semiconductor device according to this embodiment. Here, the processes described in FIGS. 8 and 9A are performed in reflow apparatus 1 shown in FIG. 1.

Figure 4A:
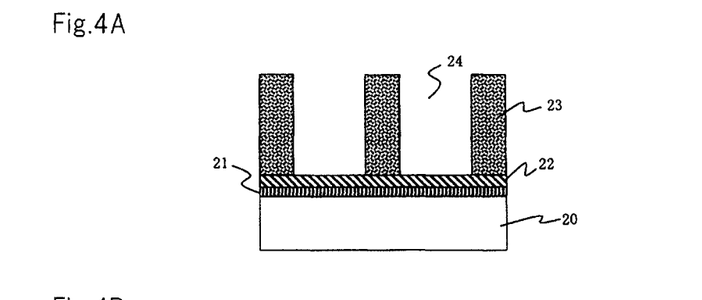
FIG. 4A is a cross sectional view depicting a method of forming the bumps of the semiconductor device according to this embodiment.

As shown in FIG. 4A, barrier film 21 having a film thickness of 150 nm is formed on semiconductor substrate 20 so as to cover the top surface of semiconductor substrate 20, and seed film 22 having a film thickness of 600 nm is formed on barrier film 21. Here, barrier film 21 is made of titanium (Ti), and seed film 22 is made of copper (Cu). These films are formed by sputtering. In addition, although not shown in FIG. 4A, transistors, interlayer insulating films, contact plugs, wires in a plurality of layers, or the like are formed on semiconductor substrate 20. Subsequently, film resist 23 having a film thickness of 20 μm is attached to seed film 22 so as to cover the top surface of seed film 22. After that, holes 24 are formed in film resist 23 at predetermined positions to expose the surface of seed film 22 by photolithography.

Figure 4B:
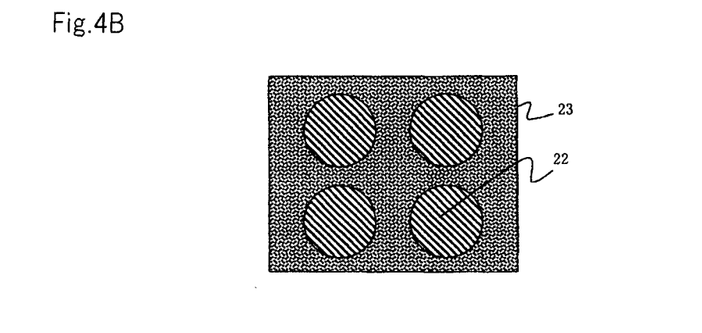
FIG. 4B is a plan view depicting the method of forming the bumps of the semiconductor device according to this embodiment.

FIG. 4B is a plan view depicting the semiconductor device seen from above after holes 24 are formed. Because holes 24 shown in FIG. 4A are openings that reach the top surface of seed film 22, the top surface of seed film 22 is partially exposed in holes 24 as shown in FIG. 4B.

Figure 5:
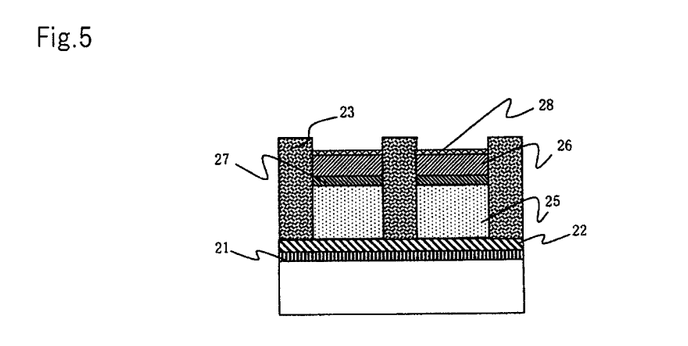
FIG. 5 is a cross sectional view depicting the method of forming the bumps of the semiconductor device according to this embodiment.

Subsequently, as shown in FIG. 5, copper is deposited in a film having a thickness of 15 μm in the bottom part of holes 24 by plating for forming electrodes 25 as the surface of seed film 22 exposed in the bottom part of holes 24 is used for a seed. Because the film thickness of film resist 23 is 20 μm and the thickness of electrode 25 is 15 μm, the top surface of electrode 25 is located in hole 24. Conversely, electrode 25 is formed in hole 24 in such a thickness that the hole is not buried completely, that is, hole remains above electrode 25. After that, silver tin (AgSn) solder is deposited in a film having a thickness of 3 μm on electrode 25 by plating for forming bump 26.

At this time, large projections and depressions at a height of about 0.5 μm are locally formed on the surface of bump 26. Moreover, alloy layer 27 having a film thickness of about 1 μm is formed in the interface between electrode 25 and bump 26 at the same time of forming bumps 26. Alloy layer 27 is substantially made of a CuSn alloy. Although the solder that forms bump 26 is made of AgSn, the CuSn alloy is preferentially formed than CuAg alloy by using Cu of electrode 25, and a CuAg alloy is rarely formed. The semiconductor substrate is removed a plating apparatus after bumps 26 are formed, and oxide film 28 is formed on the top surface of bump 26 by natural oxidation of silver tin solder. In addition, because the side surfaces of electrode 25 and bump 26 are surrounded by film resist 23, bump 26 will not cover the side surface of electrode 25.

Subsequently, as shown in FIG. 6, film resist 23 is removed with a chemical solution such as acetone ($CH_3COCH_3$). Film resist 23 is removed to expose seed film 22a that is not covered with electrode 25. In addition, after removing film resist 23, the side surface of bump 26 made of silver tin solder is also naturally oxidized, and the exposed surface of bump 26 is covered with oxide film 28.

Subsequently, exposed seed film 22a and barrier film 21a that are in contact with seed film 22a in barrier film 21 (see FIG. 6) are removed by using a chemical solution such as sulfuric acid ($H_2SO_4$). FIG. 7 shows a cross section after seed film 22a and barrier film 21a are removed. At this time, oxide film 28 remains, which is not removed, as shown in FIG. 7. It is necessary to remove oxide film 28 that covers the surface of bump 26 because it becomes a factor in inhibiting the reflow of bump 26, which is performed in the later process.

Subsequently, in order to continuously perform the removal of oxide film 28 and the reflow of bump 26 described above, the following processing operation is performed on the semiconductor device shown in FIG. 7 in reflow apparatus 1 shown in FIG. 1.

First, plasma containing hydrogen is generated in chamber 4 shown in FIG. 1, and the plasma containing hydrogen is applied onto oxide film 28 from thereabove as shown in FIG. 8. In this processing operation, oxide film 28 is removed using the reducing process of a hydrogen radical contained in the plasma containing hydrogen. At this time, oxide film 28 is removed while the first radiant heat from heater stage 3, that is a heat source, is transferred to semiconductor substrate 20, as distance H1 (see FIG. 3A) between heater stage 3 and semiconductor substrate 20 is 10 mm. Although the hydrogen radical is applied onto the entire surface of semiconductor substrate 20, it only acts on oxide film 28, which causes no problem.

In addition, because oxide film 28 inhibits the effect of reflow for smoothing the solder surface, it is important that the irradiation time of the hydrogen radical be set to a time period during which oxide film 28 can be completely removed. In this embodiment, the irradiation time of the hydrogen radical is 30 seconds as described later.

Figure 9B:
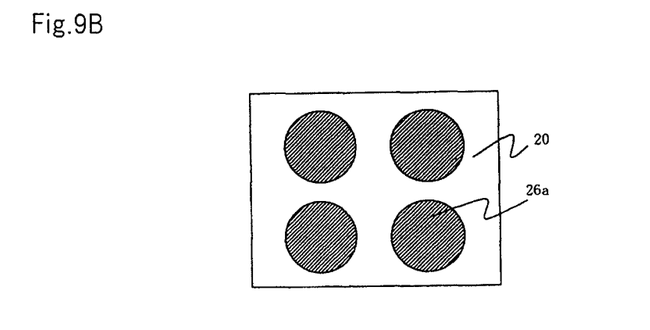
FIG. 9B is a plan view depicting the method of forming the bumps of the semiconductor device according to this embodiment.

After removing oxide film 28, support 11 is lowered to set distance H2 (see FIG. 3B) between heater stage 3 and semiconductor substrate 20 to 0.15 mm. Semiconductor substrate 20 is then heated with second radiant heat from heater stage 3 that is a heat source, and heat is conductively transferred from semiconductor substrate 20 to bumps 26 for reflowing bumps 26 that have projections and depressions on the surface. The solder is once melted by reflow, and dome-shaped bump 26a having smooth surface is formed by surface tension of the solder in cooling the solder later as shown in FIG. 9A. FIG. 9B is a plan view depicting the semiconductor device seen from above after forming bumps 26a.

If projections and depressions locally remain on the solder surface, air bubbles will enter the solder which will increase electrical resistance in compression bonding of bumps 26 formed on each of two semiconductor devices, resulting in degraded electrical characteristics of these semiconductor devices. In this embodiment, the above-mentioned processing operation in the reflow process prevents projections and depressions from remaining locally. Because the overall shape of bump 26a is in a dome shape, projections and depressions are provided when seen as a whole. However, the projections and depressions mentioned here mean local projections and depressions that exist on the surface forming the dome shape, but not on the overall form.

In addition, even though the solder that forms bump 26 is melted, the solder will not wet the side surface of electrode 25, which is provided below bump 26, and will not extend to the side surface. This is because the solder does not extend below the side surface of alloy layer 27, since alloy layer 27 made of a CuSn alloy, which has superior solder wettability than electrode 25, exists between electrode 25 and bump 26. The absence of alloy layer 27 causes the solder to follow the side surface of electrode 25 and extend therebelow, and the amount of solder on the top surface of electrode 25 is small, causing a difficulty of forming dome-shaped bump 26a. As a result, a problem arises in which it is difficult to bond two semiconductor devices to each other by compression bonding. In this embodiment, in forming AgSn bamp 26 on Cu electrode 25 by plating, CuSn alloy layer 27 is formed in a self-aligning manner at the same time, so that it is possible to reliably form alloy layer 27 and to avoid the above-mentioned problem.

Next, process conditions in processing the bumps of the semiconductor device according to this embodiment in reflow apparatus 1 will be described with reference to the timing chart shown in FIG. 10.

Figure 10:
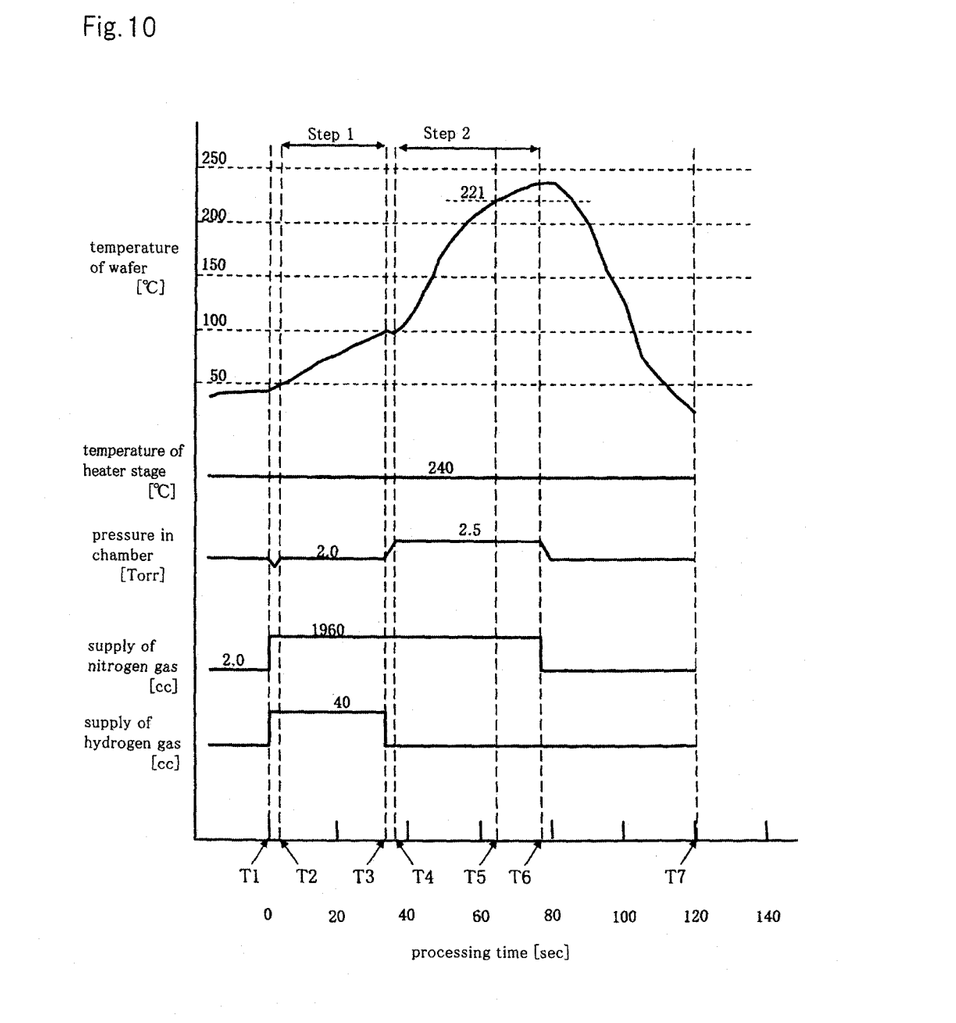
FIG. 10 is a timing chart of process conditions in processing the semiconductor device according to this embodiment using the fabrication apparatus shown in FIG. 1.

The horizontal axis in a graph shown in FIG. 10 indicates the processing time, and the vertical axis indicates the process conditions. In addition, reference numerals and signs in the description correspond to reference numerals and signs shown in FIG. 1. In addition, "Torr" is used for the unit of pressure; 1 Torr=133.3 Pa.

First, wafer 2 is loaded from a load lock chamber, not shown, into chamber 8, and wafer 2 is placed on support arms 11a in the state shown in FIG. 3A. At this time, because support 11 is lifted, distance H1 between wafer 2 and heater stage 3 is 10 mm. Processing is started (T1=0 second) to open valve 15, and a process gas is then supplied to chamber 4. The process gas is a mixed gas including 2% of hydrogen ($H_2$) and 98% of nitrogen ($N_2$). 40 cc of hydrogen are supplied to chamber 4 per unit time, and 1,960 cc of nitrogen are supplied. The process gas is turned into plasma in chamber 4 to generate a hydrogen radical.

The pressure in the inside of chamber 8 is at 2 Torr at the start of processing. On introducing the process gas into chamber 8, the pressure in the inside of chamber 8 is temporarily unstable. Because of this, processing waits for three seconds (T2=3 seconds) after the start of supplying the process gas for stabilizing the pressure in the inside of chamber 8.

On the other hand, the temperature of heater stage 3 is set to a temperature of 240° C. at the start of processing. Since distance H1 is 10 mm, the temperature rise rate of wafer 2 is 100° C./min. The temperature rise of wafer 2 is caused by the above-mentioned first radiant heat in addition to the energy conversion of the hydrogen radical colliding against wafer 2 into thermal energy.

As described above, because bumps 26 on wafer 2 are exposed to the hydrogen radical in Step 1 in which the processing time is from T2 to T3 (=33 seconds), oxide film 28 formed on the surface is reduced and removed. While this is happening, the temperature of wafer 2 is increased to a temperature of 100° C. Here, suppose that the temperature rise that is caused by the first radiant heat does not occur in wafer 2, then a problem will arise in which the temperature of wafer 2 will not increase to 100° C. by the end of Step 1 and it will take time to increase the temperature of wafer 2 in the subsequent step. The first radiant heat preheats wafer 2 to allow the temperature of wafer 2 to rise smoothly in Step 2.

The supply of hydrogen is stopped when the processing time reaches T3, and only nitrogen is supplied to chamber 8. Moreover, support 11 is lowered, and wafer 2 is placed on holding pins 10a when the processing time reaches T4 (=35 seconds). The pressure in the inside of chamber 8 is increased to 2.5 Torr and stabilized when the processing time reaches T4. After the processing time reaches T4, distance H2 between wafer 2 and heater stage 3 is as close as 0.15 mm. Because of this, the temperature of wafer 2 is rapidly increased from a temperature of 100° C. mainly due to the second radiant heat, and reaches a temperature of 221° C., which is the melting point of silver tin solder, when the processing time reaches T5 (=64 seconds). As described above, the amount of second radiant heat that wafer 2 receives is greater than the amount of first radiant heat.

Silver tin solder begins to melt when the processing time reaches T5. On liquefying silver tin solder, projections and depressions on the surface are smoothened, and the temperature of wafer 2 reaches a temperature of 240° C., which is the same as the temperature of heater stage 3, when the processing time reaches T6 (=77 seconds). When the processing time reaches T6, the supply of nitrogen to chamber 8 is stopped, support 11 is lifted, and the distance between wafer 2 and heater stage 3 is set to distance H1. Next, wafer 2 is unloaded from chamber 8 to the load lock chamber (not shown). Processing waits until the processing time reaches T7, the temperature of wafer 2 is decreased to a temperature 50° C. or less, and then wafer 2 is taken out of the load lock chamber.

As described above, in Step 2 of the processing time from T4 to T6, because the solder that forms bumps 26 is once melted in the processing time from T5 to T6, bumps 26 are formed in dome-shaped bumps 26a during the period in which the temperature is decreased until the processing time reaches T7 (=122 seconds).

Moreover, the case is described in which the distance between wafer 2 and heater stage 3 is set to distance H1 at the start of cooling wafer 2 after Step 2. However, distance H1 is not limited to 10 mm, which may be greater than 10 mm. Because a distance of 10 mm is enough to accomplish the purpose, it is unnecessary to increase distance H1, which might result in a complicated configuration of the apparatus. Furthermore, wafer 2 is held in the load lock chamber until the temperature of wafer 2 is decreased to a temperature of 50° C. or less. However, it is also possible to hold wafer 2 in chamber 8 until the temperature of wafer 2 reaches a temperature of 50° C. The method of cooling wafer 2 is not limited to the methods described above.

In addition, in the oxide film removing process and the reflow process mentioned above, the processing time in Step 1 and Step 2 is individually determined in advance from experiments, and the processing time for Step 1 and Step 2 is set. An exemplary experiment for determining the processing time is one in which a thermocouple is mounted on the front surface of wafer 2, the height of support 11 is controlled as similar to the above-mentioned processes while the time and temperature of wafer 2 are recorded, the time for which the temperature reaches a temperature of 100° C. is determined as the processing time for Step 1, and the time for which the temperature reaches a temperature of 240° C. after Step 1 is determined as the processing time for Step 2, based on the records of changes in the temperature.

In accordance with the method of forming the bumps of the semiconductor device according to this embodiment, the wafer is separated from the heater stage for non-contact in reflowing the solder that is the material for the bump. Thus, it is possible to uniformly heat the entire surface of the wafer using the radiant heat from the heater stage. As a result, it becomes possible to stably smooth the surface of the solder that forms the bump and to stably form a dome shape.

Moreover, in the process of removing the oxide film on the bump surface, the semiconductor substrate is preheated with an amount of radiant heat that is smaller than the amount of radiant heat in the reflow process for the solder. Thus, the temperature of the semiconductor substrate is smoothly increased in the reflow process.

Furthermore, the process of removing the oxide film on the bump surface and the reflow process for the solder are performed in the same chamber. Thus, it is unnecessary to carry the wafer between chambers as compared with the case where these two processes are performed in separate chambers, and it becomes possible to reduce the processing time from the start of the oxide film removal process to the end of the reflow process.

In addition, the distance between the wafer and the heater stage is varied for changing the temperature rise rate of the wafer while the temperature of the heater stage to be a heat source is kept constant. Because of this, it is possible to smoothly switch the temperature rise rate of the wafer to reduce the processing time for the reflow process, as compared with the case where the distance between the wafer and the heater stage is made constant and the temperature of the heater stage is varied. Moreover, because the distance between the wafer and the heater stage can be changed while the vacuum degree in the chamber is maintained, it is therefore possible to perform the reflow process for the bump after the oxide film removal process has been completed without exposing the wafer to the air.

The apparatus for fabricating a semiconductor device according to this embodiment is an apparatus for fabricating a semiconductor device having a plurality of bumps formed on a semiconductor substrate. The apparatus includes: a heater stage that heats the semiconductor substrate; a holder provided on the heater stage for holding the semiconductor substrate by point contact; a support member that supports the semiconductor substrate on the heater stage and carries the semiconductor substrate onto the holder; and a control unit that controls heating in which the semiconductor substrate held on the holder is heated with radiant heat from the heater stage.

Moreover, the control unit may change a quantity of the radiant heat from the heater stage by varying the height of the support member that supports the semiconductor substrate. Furthermore, a groove may be provided on the heater stage to accommodate the support therein.

It is apparent that the present invention is not limited to the above embodiments, but may be modified and changed without departing from the scope and spirit of the invention.

What is claimed is:

1. A method of fabricating a semiconductor device having a plurality of bumps formed on a semiconductor substrate, the method comprising:

removing, after forming solder for forming the plurality of bumps on the semiconductor substrate, an oxide film formed on a surface of the solder while heating the semiconductor substrate with first radiant heat, the semiconductor substrate being supported during the removing step by plural support arms that extend a first distance through a heater stage that supplies the first radiant heat; and heating the semiconductor substrate with an amount of second radiant heat that is greater than the amount of the first radiant heat to reflow the solder from which the oxide film is removed, the semiconductor substrate being supported during the heating step by tapered points of plural holding pins that are spaced from the plural support arms and that extend a second distance through the heater stage that also supplies the second radiant heat, the second distance being less than the first distance, wherein the tapered points of the plural holding pins each have a point contact with the semiconductor substrate when supporting the semiconductor substrate so that a ratio of conductive heat transfer to radiant heat transfer is negligible.

2. The method of fabricating a semiconductor device according to claim 1, wherein the step of removing the oxide film is the step of removing the oxide film formed on the surface of the bump by applying plasma containing hydrogen.

3. The method of fabricating a semiconductor device according to claim 1, wherein the step of removing the oxide film and the step of reflow are performed in the same chamber of the same apparatus.

4. A method of fabricating a semiconductor device comprising:

(a) sequentially forming a barrier film and a seed film made of Cu on a semiconductor substrate by sputtering;

(b) forming a film resist on the semiconductor substrate and forming a hole in the film resist at a predetermined position to expose a surface of the seed film therein after said step (a);

(c) forming a Cu electrode in the hole by plating wherein the surface of the seed film exposed in a bottom part of the hole is a seed;

(d) forming an AgSn solder layer in the hole on the Cu electrode and simultaneously forming an alloy layer made of a CuSn alloy between the solder layer and the Cu electrode;

(e) removing the film resist as well as forming an oxide film on the solder on a top surface and a side surface of the solder layer after said step (d);

(f) placing the semiconductor substrate in a reflow apparatus after said step (e);

(g) applying hydrogen plasma to the semiconductor substrate in the reflow apparatus to reduce and remove the oxide film on the solder; and (h) reflowing the solder from which the oxide film is removed to form a dome-shaped bump on a top surface of the alloy layer, wherein said step (g) includes a process of heating the semiconductor substrate with first radiant heat, the semiconductor substrate being supported during the step (g) by plural support arms that extend a first distance through a heater stage that supplies the first radiant heat, wherein said step (h) includes a process of heating the semiconductor substrate with second radiant heat that is greater than the first radiant heat to reflow the solder, the semiconductor substrate being supported during the step (h) by tapered points of plural holding pins that are spaced from the plural support arms and that extend a second distance through the heater stage that also supplies the second radiant heat, the second distance being less than the first distance, and wherein the tapered points of the plural holding pins each have a point contact with the semiconductor substrate when supporting the semiconductor substrate so that a ratio of conductive heat transfer to radiant heat transfer is negligible.

* * * * *